United States Patent
Balasubramaniyan et al.

(10) Patent No.: US 10,374,092 B2
(45) Date of Patent: Aug. 6, 2019

(54) POWER AMPLIFIER RAMPING AND POWER CONTROL WITH FORWARD AND REVERSE BACK-GATE BIAS

(71) Applicant: GLOBALFOUNDRIES INC., Grand Cayman (KY)

(72) Inventors: Arul Balasubramaniyan, Plano, TX (US); Thomas Gregory Mckay, Boulder Creek, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 306 days.

(21) Appl. No.: 15/488,615

(22) Filed: Apr. 17, 2017

(65) Prior Publication Data

US 2018/0302038 A1 Oct. 18, 2018

(51) Int. Cl.
| | |
|---|---|
| H01L 29/78 | (2006.01) |
| H01L 29/786 | (2006.01) |
| H03F 3/45 | (2006.01) |
| H03F 1/02 | (2006.01) |
| H03F 1/22 | (2006.01) |
| H03F 3/195 | (2006.01) |
| H03F 3/24 | (2006.01) |
| H03F 3/72 | (2006.01) |

(52) U.S. Cl.
CPC .. *H01L 29/78603* (2013.01); *H01L 29/78648* (2013.01); *H03F 1/0277* (2013.01);
(Continued)

(58) Field of Classification Search
CPC .................................................. H01L 29/78603
See application file for complete search history.

(56) References Cited

U.S. PATENT DOCUMENTS 5,466,348 A * 11/1995 Holm-Kennedy ..........................
G01N 33/54373
204/403.01
7,664,473 B2 2/2010 Ishikawa et al.
(Continued)

FOREIGN PATENT DOCUMENTS

| EP | 2582042 A1 | 4/2013 |
| WO | 2006118184 A1 | 11/2006 |

(Continued)

OTHER PUBLICATIONS

Jacquet, Back-biasing for FD-SOI—a simple way to meet power/performance targets, Symposium, Nov. 2013, p. 1-6, SOI Industry Consortium.

*Primary Examiner* — Patricia T Nguyen
(74) *Attorney, Agent, or Firm* — David Cain; Hoffman Warnick LLC

(57) ABSTRACT

Embodiments of the present disclosure provide a circuit structure and method for power amplifier control with forward and reverse voltage biases to transistor back-gate regions. A circuit structure according to the disclosure can include: a power amplifier (PA) circuit having first and second transistors, the first and second transistors each including a back-gate region, wherein the back-gate region of each of the first and second transistors is positioned within a doped substrate separated from a semiconductor region by a buried insulator layer; and an analog voltage source coupled to the back-gate regions of the first and second transistors of the PA circuit, such that the analog voltage source alternatively supplies a forward bias voltage or a reverse bias voltage to the back-gate regions of the first and second transistors of the PA circuit to produce a continuously sloped power ramping profile.

20 Claims, 10 Drawing Sheets

(52) U.S. Cl.
CPC ............ *H03F 1/223* (2013.01); *H03F 3/195* (2013.01); *H03F 3/245* (2013.01); *H03F 3/45179* (2013.01); *H03F 3/72* (2013.01); H03F 2200/451 (2013.01); H03F 2200/511 (2013.01); H03F 2203/45112 (2013.01); *H03F 2203/45228* (2013.01); *H03F 2203/45342* (2013.01); *H03F 2203/45394* (2013.01); *H03F 2203/45731* (2013.01)

(56) References Cited

U.S. PATENT DOCUMENTS

| | | | |
|---|---|---|---|
| 8,478,213 B2 | 7/2013 | Muhammad | |
| 9,024,387 B2* | 5/2015 | Erickson | H01L 21/845 |
| | | | 257/368 |
| 9,391,577 B2 | 7/2016 | Stroet | |
| 9,799,392 B2* | 10/2017 | Han | G11C 11/4076 |
| 9,831,666 B2* | 11/2017 | Parthasarathy | H02H 9/046 |
| 10,249,609 B2* | 4/2019 | Salcedo | H01L 27/0262 |
| 2007/0001767 A1 | 1/2007 | Nilson | |
| 2013/0215995 A1 | 8/2013 | Genik | |
| 2013/0341729 A1* | 12/2013 | Hisamoto | H01L 21/8249 |
| | | | 257/378 |
| 2015/0194935 A1 | 7/2015 | Kim | |
| 2016/0173036 A1 | 6/2016 | Vogt et al. | |
| 2019/0067308 A1* | 2/2019 | Yun | H01L 27/11529 |

FOREIGN PATENT DOCUMENTS

| | | |
|---|---|---|
| WO | 2008047323 A1 | 4/2008 |
| WO | 2013053661 A1 | 4/2013 |

\* cited by examiner

POWER AMPLIFIER RAMPING AND POWER CONTROL WITH FORWARD AND REVERSE BACK-GATE BIAS

TECHNICAL FIELD

Embodiments of the disclosure relate generally to circuit structures, circuit processing technology and, more particularly, to circuit structures and methods for controlling one or more power amplifier (PA) circuits. The various embodiments described herein can be used in a variety of applications, e.g., signal transmission circuits of wirelessly networked hardware.

BACKGROUND

In electrical hardware, a transistor is a critical component for implementing digital and analog circuitry designs. Generally, a transistor includes three electrical terminals: a source, a drain, and a gate. By applying different voltages to the gate terminal, the flow of electric current between the source terminal and the drain terminal of the transistor can be switched on or off. The presence or absence of an applied voltage at the gate terminal of a transistor can be identified as "on" and "off" states of the transistor. Thus, transistors can serve as a switching element in various circuit designs, e.g., by manipulating a voltage applied to the gate of each transistor and thereby affecting the flow of electrical current between source and drain terminals of each transistor. These attributes cause a transistor to be a fundamental component in power amplification circuitry, e.g., RF amplifiers, oscillators, filters, etc. During operation, transistors in an amplifier circuit can have fixed direct current (DC) voltages applied to their gate, source, and/or drain terminals while an alternating current (AC) voltage to be amplified is applied to one or more terminals in addition to the fixed DC voltage.

Transistor design and placement can influence the electrical behavior of interconnected elements in an electronic circuit. The use of multiple interconnected devices over a wide area, colloquially known as "internet of things" or "IOT," is a rapidly growing area of electronics engineering. Each interconnected device in an IOT arrangement can include one or more power amplifiers to provide signal transmission and reception with respect to other devices in the same network. Each device can be structured to operate with reduced power consumption until signals are transmitted or received, e.g., using an antenna-transceiver assembly. Activating power amplifier circuits for signal transmission, known in the art as power ramping operation, has an associated transition time, i.e., power ramping time profile. Reducing the power ramping time profile for power ramping operation of an amplifier is a technical challenge. In the context of IOT systems, power amplifier output may need to change depending on the reception at a given time, thereby requiring substantial power control flexibility during operation. Past attempts to meet these requirements for power ramping time profile and power control have involved costly additions to circuit hardware and complexity, e.g., by adding additional chips, feedback loops, etc. Other attempts may be associated with a delayed power output, e.g., in which the output voltage from the amplifier remains low for several microseconds after being activated, before steadily increasing to the desired output.

SUMMARY

A first aspect of the present disclosure provides a circuit structure including: a power amplifier (PA) circuit having first and second transistors, the first and second transistors each including a back-gate region, wherein the back-gate region of each of the first and second transistors is positioned within a doped substrate separated from a semiconductor region by a buried insulator layer; and an analog voltage source coupled to the back-gate regions of the first and second transistors of the PA circuit, such that the analog voltage source alternatively supplies a forward bias voltage or a reverse bias voltage to the back-gate regions of the first and second transistors of the PA circuit to produce a continuously sloped power ramping profile.

A second aspect of the present disclosure provides a method for adjusting power amplification in a circuit structure, the method including: applying one of a forward or a reverse voltage bias to first and second transistors in a power amplifier (PA) circuit at back-gate regions thereof during operation in a dormant mode, the back-gate regions of the first and second transistors including a doped substrate separated from a channel region by a buried insulator layer; operating the circuit structure in an active mode; and applying the other of the forward or the reverse voltage bias to the back-gate regions of the first and second transistors in the power amplifier (PA) circuit while operating the circuit structure in the active mode to produce a continuously sloped power ramping profile.

A third aspect of the present disclosure provides a circuit structure including: a power amplifier (PA) circuit having first and second transistors, each of the first and second transistors including: a dopant-implanted substrate, the dopant-implanted substrate defining a back-gate region; a buried insulator layer positioned on the dopant-implanted substrate, and a fully-depleted semiconductor-on-insulator (FDSOI) layer positioned on the buried insulator layer, wherein the buried insulator layer separates the FDSOI layer from the back-gate region, wherein the FDSOI layer includes a source region, a channel region, and a drain region; and an analog voltage source electrically coupled to the back-gate regions of the first and second transistors of the PA circuit, such that the analog voltage source alternatively supplies a forward bias voltage or a reverse bias voltage to the back-gate regions of the first and second transistors of the PA circuit to produce a continuously sloped power ramping profile.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
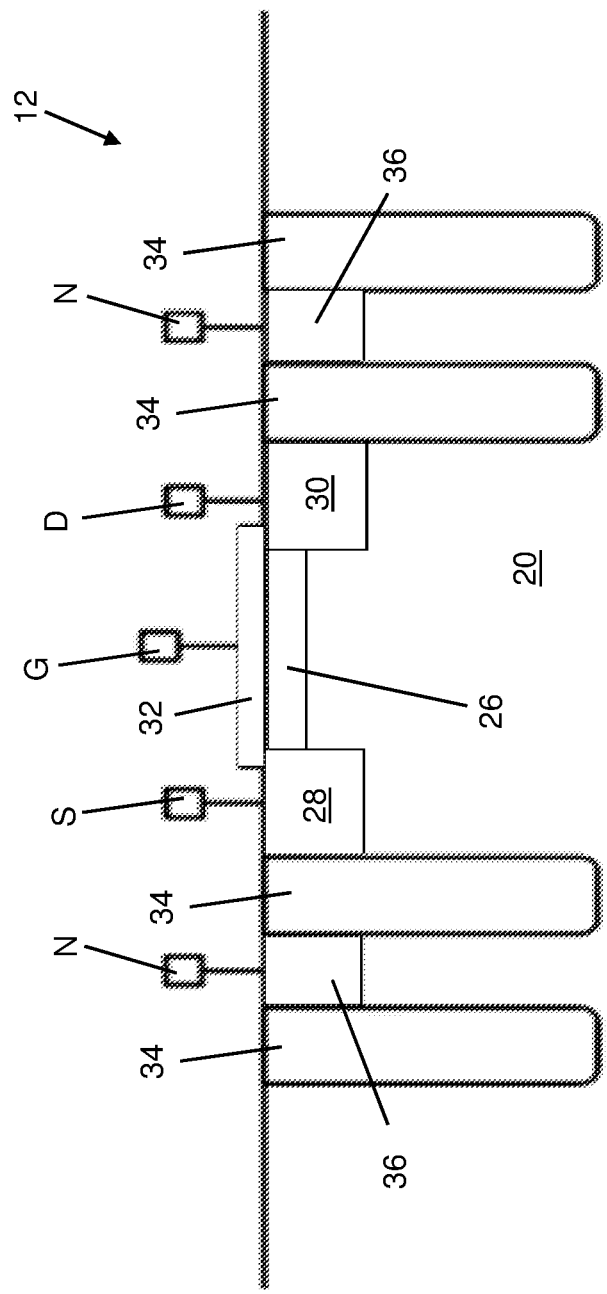
FIG. 1 shows a cross-sectional view of a conventional transistor structure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure relate to circuit structures and methods for adjusting power amplification in a circuit structure by applying forward and reverse biasing voltages to transistor bodies at back-gate regions of transistors in a power amplifier. As discussed herein, a "forward bias" generally refers to a voltage bias (e.g., a positive polarity voltage) at which the potential barrier (threshold voltage "$V_{th}$") at a p-n or metal-semiconductor junction (such as that within the body of a transistor) is lowered, and large current is allowed to flow from one region to another. A "reverse bias" generally refers to a voltage bias (e.g., a negative polarity voltage) at which the potential barrier ($V_{th}$) at the p-n or metal-semiconductor junction is increased and current flow from one region to another is restricted. Applying forward and reverse biasing voltages to back-gate regions can allow a user to control the ramping time between dormant and active modes of a power amplifier (PA) circuit power ramping to meet a predetermined time profile. To conserve space and reduce the total number of components, the PA circuit may include structural and operational differences relative to conventional PA circuits and/or conventional transistors. Applying the same voltage to back-gate regions of amplifier transistors according to the present disclosure can allow further control over power output from an amplifier circuit.

Referring to FIG. 1, a conventional transistor 12 is depicted as an example to emphasize structural and operational differences relative to embodiments of the present disclosure, and transistor elements included therein. Conventional transistor 12 may be fabricated, e.g., by way of conventional fabrication techniques which may operate on a bulk silicon substrate. Conventional transistor 12 thus may be formed in a substrate 20 including, e.g., one or more semiconductor materials. Substrate 20 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 20 or a portion thereof may be strained.

Source and drain nodes S, D of conventional transistor 12 may be coupled to regions of substrate 20 which include conductive dopants therein, e.g., a source region 28 and a drain region 30 separated by a channel region 26. A gate region 32 formed on channel region 26 can be coupled to a gate node G to control the formation of a conductive channel within channel region 26. A group of trench isolations 34 may be formed from electrically insulating materials such that regions 26, 28, 30 are laterally separated from parts of other transistors. As shown, trench isolations 34 form an insulating barrier between terminals 36 and regions 26, 28, 30 and/or other elements. Further features of each element in conventional transistor 12 (e.g., function and material composition) are described in detail elsewhere herein relative to similar components in an amplifier transistor 102 (FIG. 2).

Figure 2:
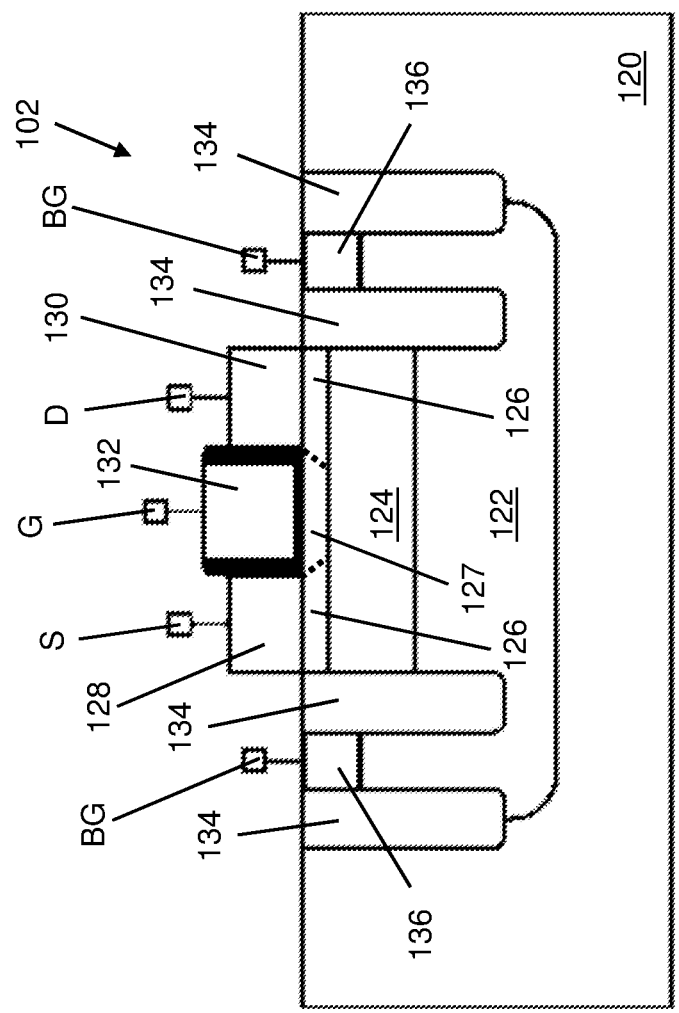
FIG. 2 shows a cross-sectional view of a transistor structure with a back-gate region beneath a buried insulator layer according to embodiments of the disclosure.

Turning to FIG. 2, a cross-sectional view of an amplifier transistor 102 which may be deployed, e.g., in structures and methods according to the disclosure, is shown. Amplifier transistor 102 can be formed with structural features for reducing the electrical resistance across source and drain terminals S, D thereof. Amplifier transistor 102 and components thereof can be formed on and within a substrate 120. Substrate 120 can include any currently known or later-developed semiconductor material including, without limitation, one or more of the example semiconductor materials described elsewhere herein relative to substrate 20 (FIG. 1). A back-gate region 122, alternatively identified as an n-type or p-typed doped well region, of substrate 120 can be implanted with one or more doping compounds to change the electrical properties thereof. Doping generally refers to a process by which foreign materials ("dopants") are added to a semiconductor structure to alter its electrical properties, e.g., resistivity and/or conductivity. Where a particular type of doping (e.g., p-type or n-type) doping is discussed herein, it is understood that an opposite doping type may be implemented in alternative embodiments. Implantation refers to a process in which ions are accelerated toward a solid surface to penetrate the solid up to a predetermined range based on the energy of the implanted ions. Thus, back-gate region 122 can include the same material composition as the remainder of substrate 120, but can additionally include dopant materials therein. A buried insulator layer 124, also known in the art as a "buried oxide" or "BOX" layer, can separate back-gate region 122 of substrate 120 from source/drain regions 126 and a channel region 127 of amplifier transistor 102. Buried insulator layer 124 therefore may be composed of one or more oxide compounds, and/or any other currently known or later-developed electrically insulative substances. Amplifier transistor 102 therefore can be embodied as a "fully-depleted semiconductor on insulator" (FDSOI) structure, distinguishable from other structures (e.g., conventional transistor 12 (FIG. 1)) by including buried insulator layer 124, back-gate nodes BG, etc., thereby allowing technical advantages such as an adjustable electric potential within back-gate region 122 of amplifier transistor 102 as discussed elsewhere herein.

Source/drain regions 126 and channel region 127 may electrically couple a source terminal 128 of amplifier transistor 102 to a drain terminal 130 of amplifier transistor 102 when transistor is in on state. A gate stack 132 can be positioned over channel region 127, such that a voltage of gate node G controls the electrical conductivity between source and drain terminals 128, 130 through source/drain regions 126 and channel region 127. Gate stack 132 can have, e.g., one or more electrically conductive metals therein, in addition to a gate dielectric material (indicated with black shading between bottom of stack and channel region 127) for separating the conductive metal(s) of gate stack 132 from at least channel region 127. A group of trench isolations 134, in addition, can electrically and physically separate the various regions of amplifier transistor 102 from parts of other transistors. Trench isolations 134 may be composed of any insulating material such as $SiO_2$ or a "high-k" dielectric having a high dielectric constant, which may be, for example, above 3.9. In some situations, trench isolations 134 may be composed of an oxide substance. Materials appropriate for the composition of trench isolations 134 may include, for example, silicon dioxide ($SiO_2$), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties.

Back-gate region 122 can be electrically coupled to back-gate node BG through back-gate terminals 136 within substrate 120 to further influence the characteristics of amplifier circuit 102, e.g., the conductivity between source and drain terminals 128, 130 through source/drain regions 126 and channel region 127. Applying an electrical potential to back-gate terminals 136 at back-gate node BG can induce an electric charge within back-gate region 122, thereby creating a difference in electrical potential between back-gate region 122 and source/drain regions 126, channel region 127, across buried insulator layer 124. Among other effects, this difference in electrical potential between back-gate region 122 and source/drain regions 126, channel region 127, of substrate 120 can affect the threshold voltage of amplifier transistor 102, i.e., the minimum voltage for inducing electrical conductivity across source/drain and channel regions 126, 127 between source and drain terminals 128, 130 as discussed herein. In particular, applying a back-gate biasing voltage to back-gate terminals 136 can lower the threshold voltage of amplifier transistor 102, thereby reducing source drain resistance and increasing drain current, relative to the threshold voltage of amplifier transistor 102 when an opposite voltage bias is applied to back-gate terminals 136. This ability of amplifier transistor 102, among other things, can allow a reduced width (saving silicon area) relative to conventional applications and transistor structures. In an example embodiment, a width of source/drain and channel regions 126, 127 (i.e., into and out of the plane of the page) can be between approximately 0.3 micrometers (μm) and approximately 2.4 μm. A length of source/drain and channel regions 126, 127 (i.e., left to right within the plane of the page) between source and drain terminals 128, 130 can be, e.g., approximately twenty nanometers (nm). FDSOI technology transistors, e.g., amplifier transistor 102, offer the ability to apply a voltage bias to back-gate region 122 to manipulate the threshold voltage $V_t$ (i.e., minimum voltage for channel formation) of amplifier transistor 102. As described herein, back-gate region n122 can allow a user to manipulate ramp power amplifier output to meet a predetermined time profile. Back-gate region 122 can alternatively be used to set a power output to a precise value, e.g., to offer improved power control.

Figure 3:
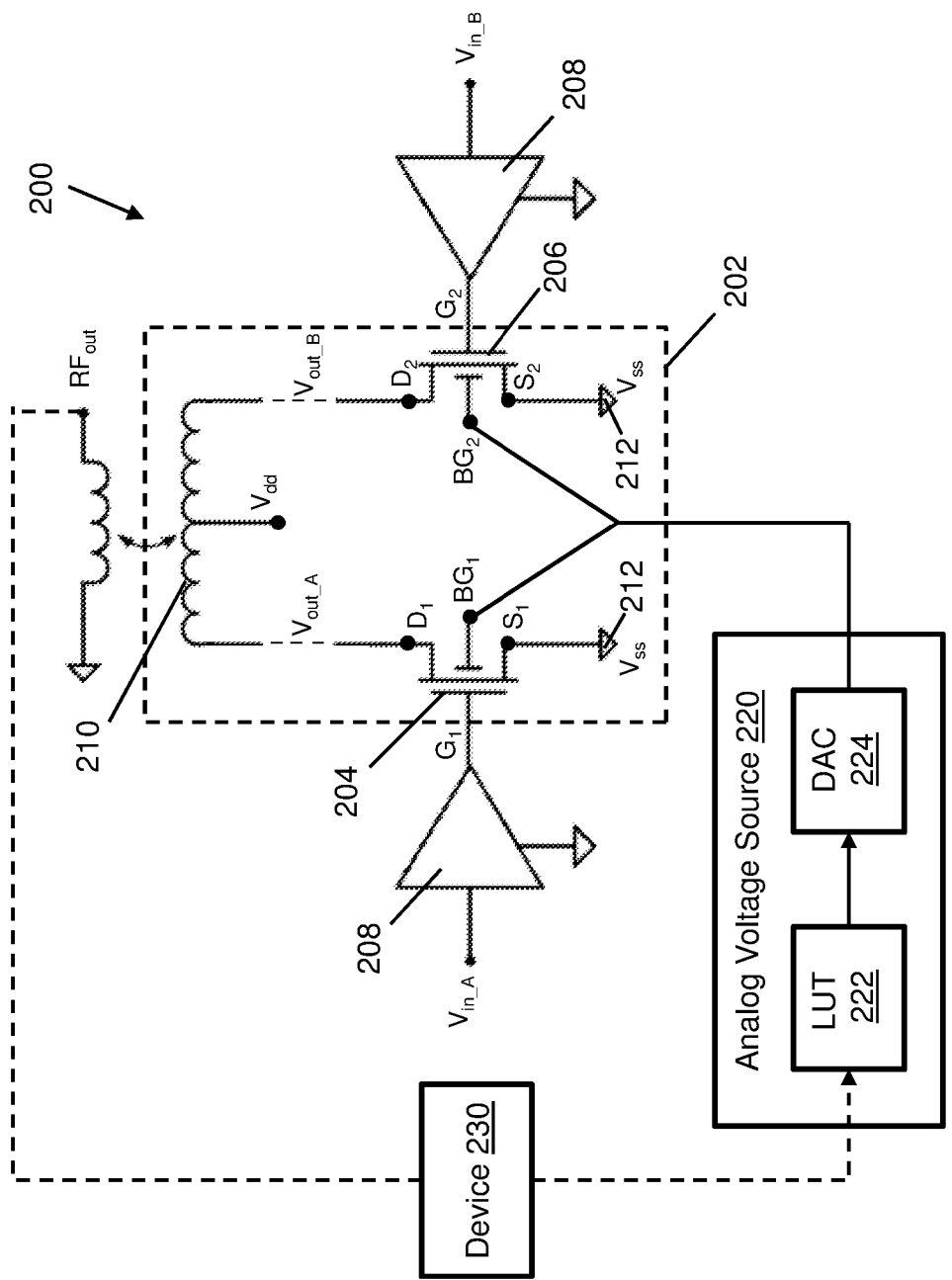
FIG. 3 shows a schematic view of a circuit structure according to embodiments of the disclosure.

Turning to FIG. 3, a circuit structure (simply "circuit" hereafter) 200 can allow a user to vary the electrical characteristics of circuit 200 during operation, e.g., power amplification. The technical advantages and features described herein can be attainable by using embodiments of amplifier transistor 102 (FIG. 2) for each transistor element of circuit 200. Circuit 200 can include, e.g., at least one power amplifier (PA) circuit 202 for magnifying the electrical output of an input signal, thereby producing an output signal. A "power amplifier" or "electronic amplifier," e.g., PA circuit 202, may be defined as an electronic circuit or sub-circuit for increasing the power of an input signal, e.g., by using a dedicated power supply voltage (e.g., "$V_{dd}$" in FIG. 3) to increase the amplitude of an input signal without fundamentally changing the shape of the signal. PA circuit 202 can include multiple transistors for controlling the passage of electrical current therethrough, and in an example can include at least a first transistor 204 and a second transistor 206 each having respective source nodes $S_1$, $S_2$, drain nodes $D_1$, $D_2$, gate nodes $G_1$, $G_2$, and back-gate nodes $BG_1$, $BG_2$ at respective positions. Thus, first and second transistors 204, 206 may be structured as embodiments of amplifier transistor 102 (FIG. 2). Each node can connect to corresponding positions on the structure of first and second transistors 204, 206, e.g., as described herein relative to FIG. 2. Back-gate nodes $BG_1$, $BG_2$ of first and second transistors 204, 206 can be electrically-coupled to the doped substrate material of back-gate region 122 (FIG. 2) in each transistor 204, 206, and back-gate region 122 can be separated from source/drain and channel regions 126, 127 (FIG. 2) by buried insulator layer 124 (FIG. 2) as also described herein. Source/drain and channel regions 126, 127 can thus take the form of an FDSOI substrate as described elsewhere herein. PA circuit 202 may include additional transistors as shown in FIG. 3 and described elsewhere herein, embodiments of the disclosure can be implemented through electrical connections to only first and second transistors 204, 206 of PA circuit 202.

PA circuit 202 can be at least partially dependent upon other electrical elements or devices for influencing the output of signals to be amplified with PA circuit 202. In particular, a group of preamplifier (PPA) circuits 208 can be electrically connected to PA circuit 202 such that an output from each PPA circuit 208 defines a voltage at gate nodes $G_1$, $G_2$ of first and second transistors 204, 206 in PA circuit 202. A preamplifier circuit generally refers to an electrical component which converts an input signal into a stronger output signal, e.g., with sufficient gain to accommodate variances from noise or interference in subsequent processing. To this extent, the output of each PPA circuit 208 can be electrically coupled to gate nodes $G_1$, $G_2$ of first and second transistors 204, 206 in PA circuit 202 to control or otherwise influence the electrical operation of PA circuit 202. More specifically, PPA circuits 208 can influence whether electrical signals will pass through or be blocked by channel regions (e.g., channel region 127 (FIG. 2)) within first and second transistors 204, 206 during operation of PA circuit 202.

PA circuit 202 can be structured to convert a differential input signal ($V_{in\_A}$ and $V_{in\_B}$) to respective outputs ($V_{out\_A}$, $V_{out\_B}$). In addition, a transformer 210 can be in electrical communication with PA circuit 202 to transform differential outputs $V_{out\_A}$, $V_{out\_B}$ to a single ended power amplifier output, $RF_{out}$. A "transformer" generally refers to an electrical device which transfers electrical energy between two circuits through electromagnetic induction, e.g., to increase or decrease alternating current (AC) voltages by a desired factor while inversely affecting the magnitude of the output current. Transformer 210 thus can be a fundamental element in the structure of PA circuit(s) 202 for producing a magnified signal amplitude. As shown, a fixed voltage ($V_{ss}$) for PA circuit 202 can be electrically coupled at voltage supply node 212 to source terminals $S_1$, $S_2$ of first and second transistors 204, 206. PPA circuits 208 can each be electrically coupled to gate nodes $G_1$, $G_2$ of transistors 204, 206 to produce differential output voltages $V_{out\_A}$, $V_{out\_B}$ based on input signals $V_{in\_A}$, $V_{in\_B}$ to PPA circuits 208. A supply voltage ($V_{dd}$) can also be applied to transformer 210 within PA circuit 202, as shown. During operation, amplifier circuit 202 can serve to amplify differential input voltages $V_{in\_A}$, $V_{in\_B}$ to produce amplified differential output voltages $V_{out\_A}$, $V_{out\_B}$ by a predetermined factor, also known as a "power ratio." Embodiments of the disclosure can reduce the ramping time between dormant and active operation of PA circuits 202 as described herein.

As noted elsewhere herein, conventional amplifier circuits may have a limited ability to transition between dormant and active (alternatively, "non-transmission" and "signal transmission") modes when conventional transistor structures (e.g., transistors 12 (FIG. 1)) are included therein. Embodiments of the present disclosure overcome this shortcoming by including an analog voltage source 220 electrically coupled to back-gate nodes $BG_1$, $BG_2$ of first and second transistors 204, 206. Analog voltage source 220 can be structured to supply a biasing voltage simultaneously to back-gate nodes $BG_1$, $BG_2$ of first and second transistors 204, 206, e.g., by being coupled to back-gate regions 122 (FIG. 2) thereof. Applying a biasing voltage in this manner can reduce the ramping time between dormant and active operating modes of PA circuit 202. An output voltage from analog voltage source 220 may be adjustable between a negative value (e.g., approximately −6.0 volts (V)) (low power) and a positive value (high or full power) (e.g., approximately 0.75V)). It is understood that the voltage values can vary to suit different devices and/or operating situations. To this extent, PA circuit 202 can offer a varied range of power control by transmitting signals at different voltage ranges, e.g., low power voltage of approximately −3.0 V or −5.0 V to high power voltage of approximately 0 V or +1.0 V. Embodiments of PA circuit 202 may be further distinct from conventional devices by being structured such that input voltage $V_{in}$ to PA circuit 202 is not dependent upon output voltage $V_{out}$ from PA circuit 202, thereby avoiding feedback loops and architecture needed to support feedback circuitry.

Figure 4:
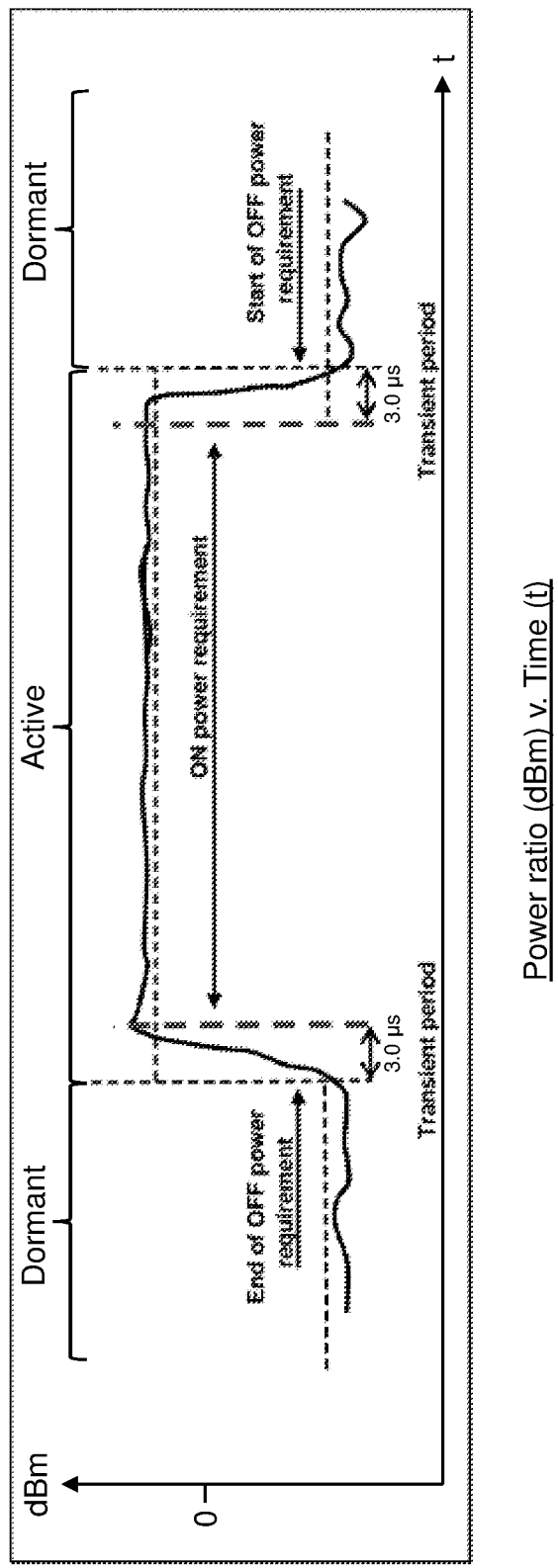
FIG. 4 shows a representative plot of power ratio (power ramp up) versus time in a circuit structure according to embodiments of the disclosure.

Referring to FIGS. 3-4 together, an example of the ratio of power output (e.g., $V_{out\_A}$, $V_{out\_B}$ at differential outputs to $V_{in\_A}$, $V_{in\_B}$ at differential inputs), e.g., in decibel-milliwatts (dBm), for PA circuit 202 is plotted against time in seconds (s) to illustrate different operating modes of circuit 200. When circuit 200 does not need to amplify power (e.g., signals are not being transmitted and received), the operation of circuit 200 and related structures (e.g., one or more devices 230 as described herein) may continue with a reduced use of power. A dormant operating mode is shown in FIG. 4 with beginning and ending time segments, and corresponding to a power ratio of less than zero. Despite being identified as a "dormant" operating mode, circuit 200 and device 230 may continue to operate, but without producing amplified signals from PA circuit 202. When circuit 200 begins operating in an active mode (e.g., signal transmission or receipt begins), PA circuit 202 can be switched on to produce an amplified at differential output voltages $V_{out\_A}$, $V_{out\_B}$. The time period between operation in dormant and active modes can be known as a ramping time or, alternatively, a transition time or delay.

Figure 5:
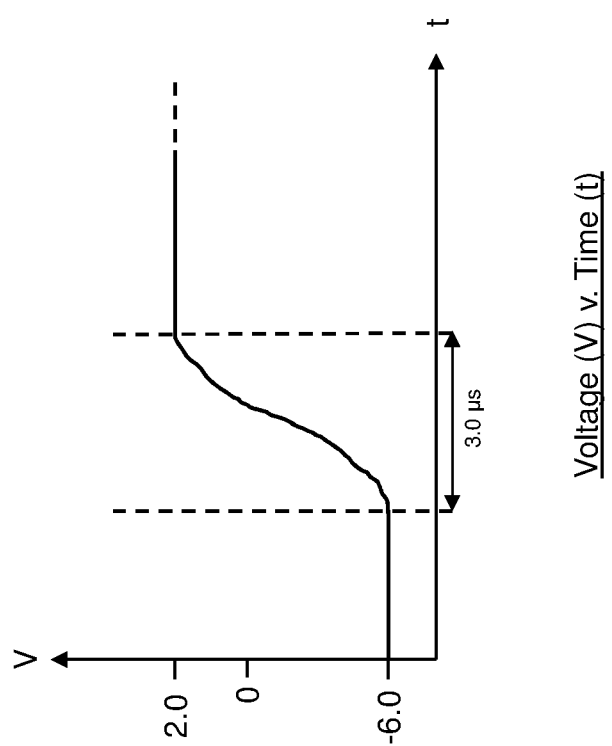
FIG. 5 shows a representative plot of voltage versus time during power ramping operation according to embodiments of the disclosure.

Referring to FIGS. 3-5 together, operational details of PA circuit 202 are discussed in further detail. In FIG. 5, an illustrative plot of output voltage (V) versus time (t) of analog voltage source 220 for PA circuit 202 is shown. Here, output voltage refers to back gate voltages at back-gate nodes $BG_1$ and $BG_2$ voltages, but may refer to other voltage outputs in alternative embodiments and/or amplifier structures. To transition between modes, analog voltage source 220 can apply an opposite voltage bias to back-gate nodes $BG_1$, $BG_2$ of transistors (e.g., first and second transistors 204, 206) to which it connects. Applying an opposite voltage bias to the back-gate nodes $BG_1$, $BG_2$ and corresponding back-gate regions 112 (FIG. 2) of each transistor 204, 206 can accelerate the transition of PA circuit 202 between producing a dormant mode power ratio (e.g., less than zero dBm) to producing a power ratio above zero dBm in active mode. Similarly, a subsequent transmission from the active mode to the dormant operating mode can cause analog voltage source 220 to apply the original voltage bias to back-gate nodes $BG_1$, $BG_2$ and accelerate its transition back to dormant mode operation. In both cases, the corresponding ramping time can be, e.g., approximately 3.0 microseconds (μs) between output voltages of approximately −6.0 V and approximately 2.0 V as shown in FIG. 5.

The ramping time and associated profile shown in FIGS. 4-5 can be attained by applying bias voltages to back-gate nodes $BG_1$, $BG_2$ of first and second transistors 204, 206 during operation, as compared to conventional amplifier circuits which may be associated with a transient period of at least thirty μs. Furthermore, applying alternate forward and reverse voltage biases to back-gate nodes $BG_1$, $BG_2$ in PA circuit 202 can produce a continuously sloped change in power ratio between dormant and active modes, as compared to conventional structures which produce an initial step in power ratio followed by a slower, non-continuous increase or decrease in power ratio between operating modes. The sharp reduction in transient time stems from alternately applying forward and reverse voltage biases to back-gate nodes $BG_1$, $BG_2$ incorporating back-gate regions shown in FIG. 2 and/or equivalent structures. As shown, power ratio and voltage can transition between dormant and active operating modes along a continuously sloped profile, i.e., a power transition curve which is not piecewise defined. More specifically, applying a forward or reverse voltage bias to back-gate regions 122 (FIG. 2) of transistors 204, 206 in PA transistor 202 can prevent the power ratio and output voltage from remaining at a single value for more than approximately 0.1 μs. By contrast, conventional amplification systems may exhibit a power ramping profile in which voltage and/or power ratio remain at a constant value for one or more microseconds before beginning to slope upward or downward at a later time. Applying forward and reverse biases to back-gate regions of transistors in an amplifier circuit, as discussed herein, thereby produces a continuously sloped power ramping profile between operation in dormant and active operating modes.

Analog voltage source 220 can include multiple subcomponents for controlling the bias voltages to back-gate nodes $BG_1$, $BG_2$ of first and second transistors 204, 206. For example, analog voltage source 220 can include a lookup table (LUT) 222 for receiving an encoded digital input representing, e.g., an operating mode and/or temperature of an electronic circuit (e.g., circuit 200) having PA circuit 202 therein. A LUT generally refers to a circuit component which indexes a particular digital input to a corresponding output. In an example, LUT 222 can receive a signal indicative of, e.g., signal transmissions and/or operating temperatures which occur during transmission of electrical signals to or from circuit 200 using PA circuit 202. As an example, an operating temperature of between approximately −10 degrees Celsius (° C.) to approximately 85° C. Thus, LUT 222 can be configured to output either a "high" or "low" voltage corresponding to inputs which represent active or dormant states of device 230 included within and/or electrically coupled to circuit 200. To this extent, device 230 can generally represent other circuit components, devices, etc., included within or coupled to circuit 200 to serve operational purposes other than power amplification (e.g., measurement, encoding, decoding, and/or implementation of other functions). Analog voltage source 220 can also include a digital-to-analog converter (DAC) 224 electrically configured to supply a predetermined forward or reverse biasing voltage, e.g., positive or negative voltages as discussed herein, to back-gate nodes $BG_1$, $BG_2$ of first and second transistors 204, 206. In an example, LUT 222 can initially output a "low" voltage representing circuit operation when circuit 200 and device 230 do not operative in active mode (e.g., do not transmit and/or receive signals). In this situation, DAC 224 can be configured to supply a negative biasing voltage to back-gate nodes $BG_1$, $BG_2$ of first and second transistors 204, 206. When the operating characteristics of circuit 200 and/or device 230 indicate that signal transmission has begun, LUT 222 can output a "high" voltage and thus cause DAC 224 to supply a forward biasing voltage to back-gate nodes $BG_1$, $BG_2$ of first and second transistors 204, 206. It is understood that the input and output voltages for each subcomponent of analog voltage source 220 to produce forward and reverse voltage biases can be modified to accommodate different operating scenarios and/or circuit designs. For example, the output from DAC 224 can vary between approximately −6.0 V to produce a reverse back-gate bias to approximately +6.0V to produce a forward back-gate bias. In an example, the voltage output from DAC 224 can be approximately −2.0 V to produce a reverse back-gate bias and +6.0 V to produce a forward back-gate bias. It is understood that the forward and reverse biases produced from DAC 224 can be modified to accommodate different operating temperatures and conditions as discussed herein. More specifically, DAC 224 can set its forward and/or reverse bias levels to be a positive, zero, or negative voltage. Analog voltage source 220 can also include, e.g., one or more filter circuits ("filter") 226 electrically coupled between the output from DAC 224 and BG nodes $BG_1$, $BG_2$, to remove predetermined frequencies (e.g., frequencies above, below, or within a targeted range of frequencies to be filtered) in the biasing output from analog voltage source 220.

Figure 6:
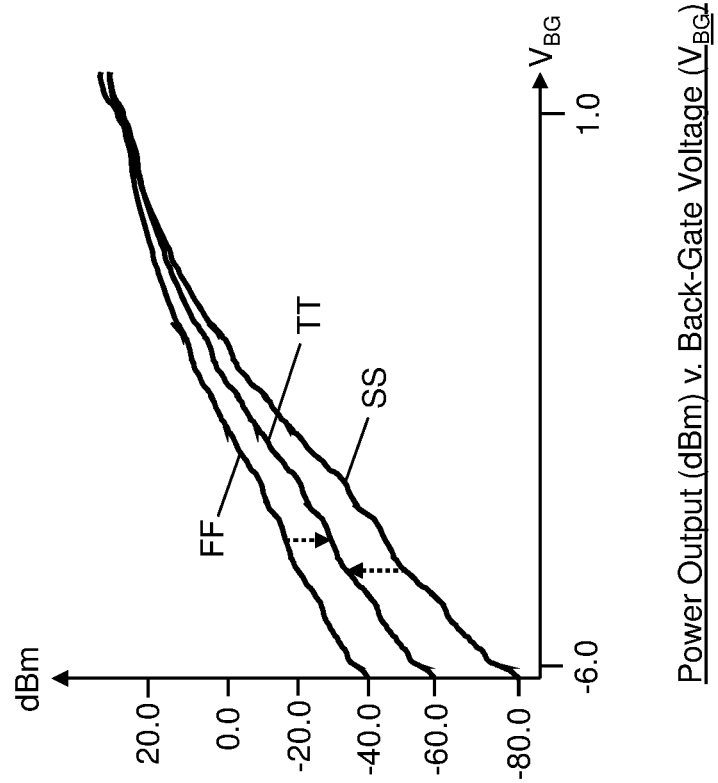
FIG. 6 shows a representative plot of power output versus back-gate voltage for three devices for power calibration according to embodiments of the disclosure.

Referring to FIGS. 3 and 6 together, LUT 222 of analog voltage source 220 can be calibrated to compensate for manufacturing variances between PA circuits 202 and/or devices 230. Circuit 200 may be designed such that power output from PA circuit 202 during a transition between operating modes generally conforms to a predetermined profile, e.g., curve "TT" of FIG. 6, for typical operation. As shown, power output in dBm may ramp from a low level (e.g., approximately −60.0 dBm at approximately −6.0 V) to an amplified level (e.g., approximately 20.0 dBm at approximately 0.75 V). However, unexpected events during and/or after manufacture of circuit 200 can cause the power output to vary from expected values. In one example, circuit 200 may exhibit a "fast corner" profile e.g., curve "FF" of FIG. 6, in which the low level power output exceeds its expected value (e.g., −40.0 dBm instead of −60.0 dBm). In another example, circuit 200 may exhibit a "slow corner" profile e.g., curve "SS" of FIG. 6, in which the low level power output is below its expected value (e.g., −80.0 dBm instead of −60.0 dBm). To prevent operating errors and/or other related issues, embodiments of the disclosure can include calibrating LUT 222 after manufacture to compensate for circuits 200 which exhibit fast corner or slow corner power outputs. In such cases, the internal logic of LUT 222 can be adjusted to offset varied manufacturing voltages and thereby move curves FF or SS upward or downward as appropriate. Such compensation is depicted in FIG. 6 by corresponding phantom lines from SS or FF to TT. Embodiments of the disclosure therefore provide hardware for providing a range of power controls to suit varying technical applications or variances between individual circuits 200 after manufacture.

Figure 7:
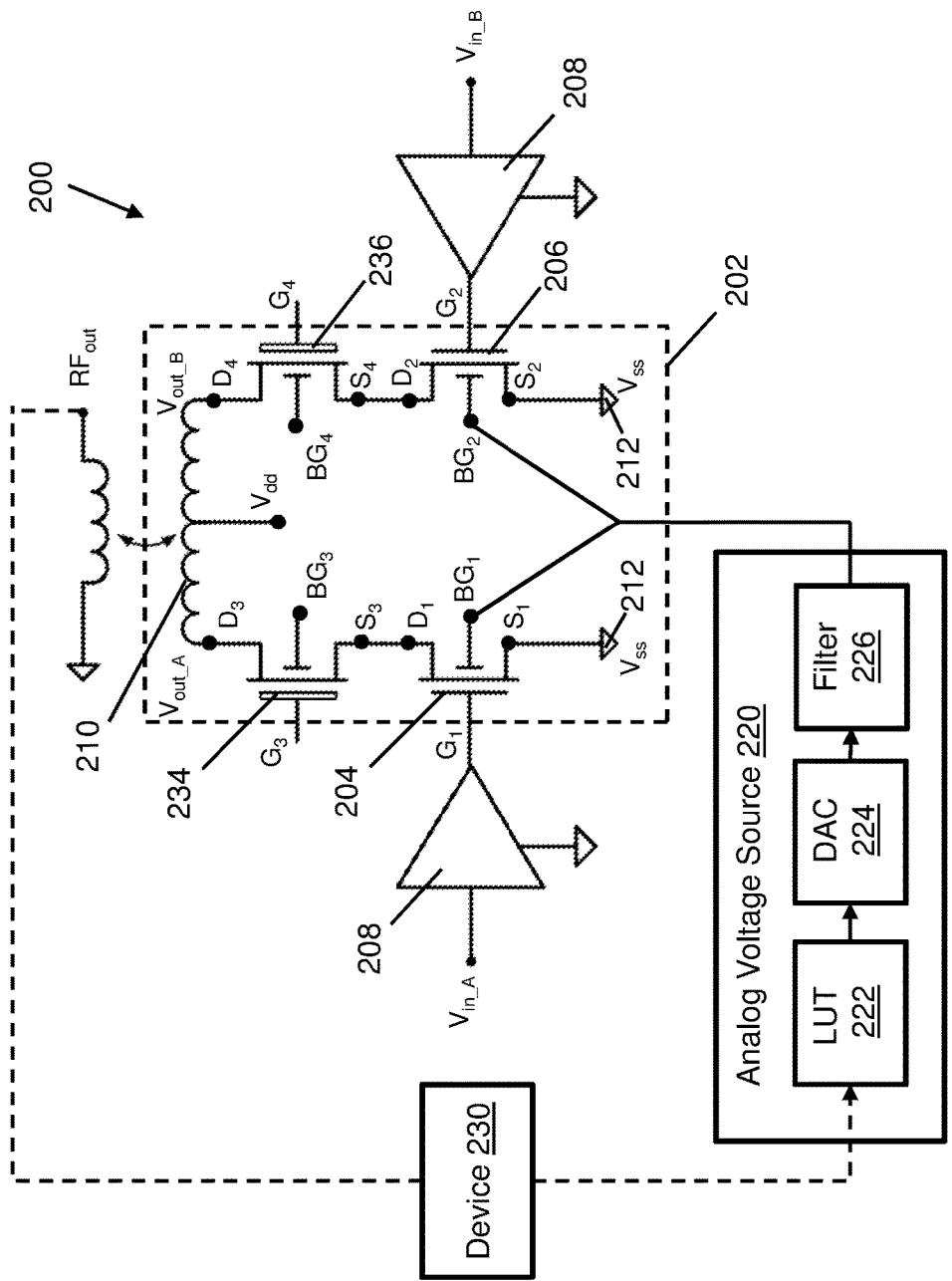
FIG. 7 shows a schematic view of another circuit structure according to embodiments of the disclosure.

Referring to FIG. 7, PA circuit 202 may also include additional structures for providing enhanced control and/or operability for power amplification. In particular, PA circuit 202 may include a cascode amplifier arrangement to remove direct input-to-output electrical coupling and thus improve isolation between the input and output signals. In this case, PA circuit 202 can include a third transistor 234 electrically coupled between transformer 210 and first transistor 204, such that a drain node $D_3$ of third transistor 234 is connected to transformer 210 while a source node $S_3$ of third transistor 234 is connected to drain node $D_1$ of first transistor 204. PA circuit 202 can also include a fourth transistor 236 electrically coupled between transformer 210 and second transistor 206, such that a drain node $D_4$ of fourth transistor 236 is connected to the opposing terminal of transformer 210 while a source node $S_4$ of fourth transistor 236 is connected to drain node $S_2$ of second transistor 206. Despite the addition of third and fourth transistors 234, 236, PA circuit 202 can produce amplified differential outputs $V_{out\_A}$, $V_{out\_B}$ and an output signal $RF_{out}$ based on differential inputs $V_{in\_A}$, $V_{in\_B}$.

Figure 8:
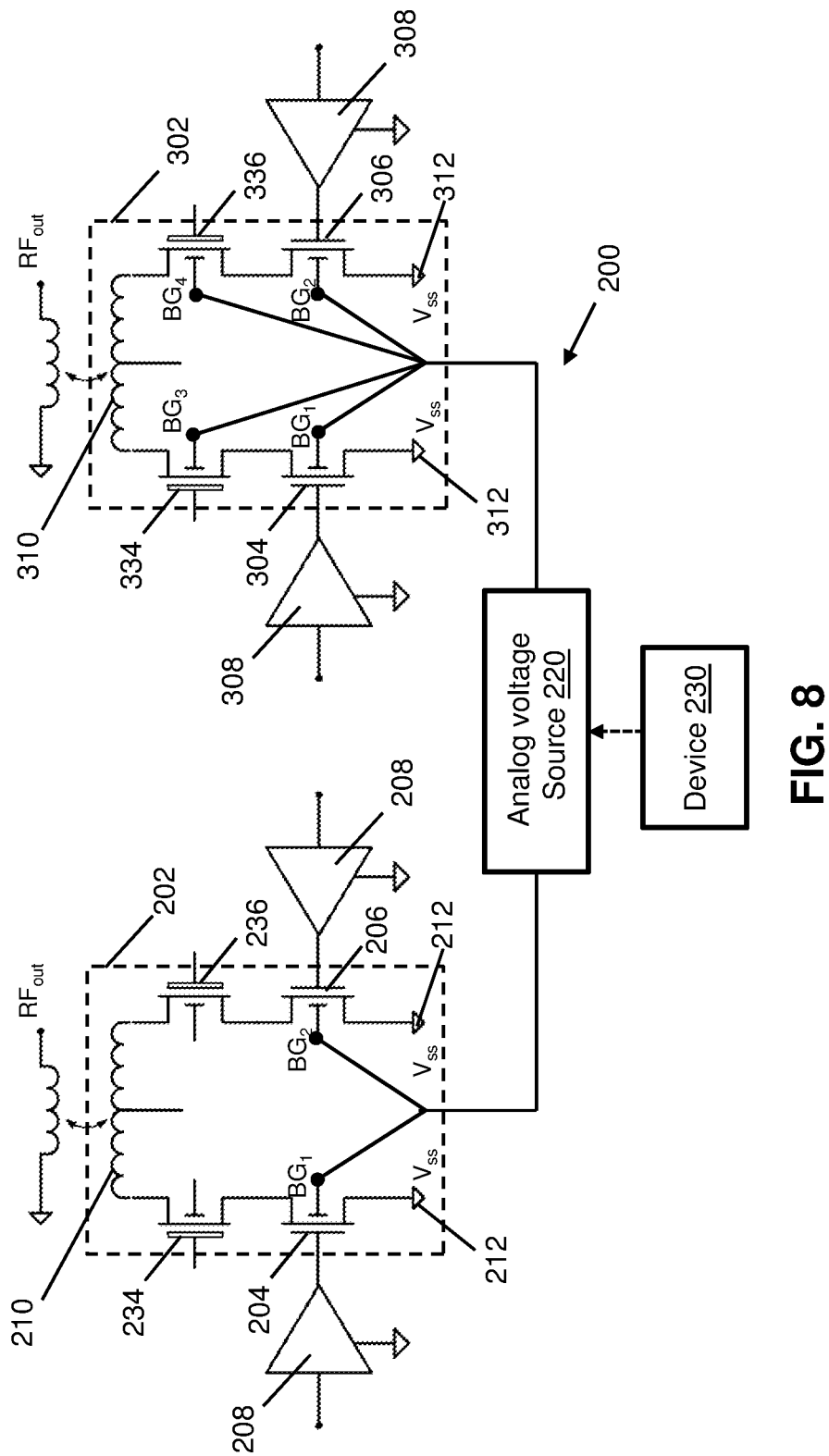
FIG. 8 shows a schematic view of yet another circuit structure according to embodiments of the disclosure.

Referring to FIG. 8, embodiments of circuit 200 can include additional and/or alternative electrical arrangements with cascode amplifiers. Similar to other embodiments described herein, analog voltage source 220 can supply forward and biasing voltages to back-gate nodes $BG_1$, $BG_2$ of first and second transistors 204, 206 in PA circuit 202. Analog voltage source 220 can additionally or alternatively be electrically coupled to another PA circuit 302 at four back-gate nodes $BG_1$, $BG_2$, $BG_3$, $BG_4$ in a cascode amplifier arrangement. PA circuit 302 can include, e.g., first and second transistors 304, 306 each electrically coupled at their gates to the output of PPA circuits 308. A transformer 310 of PA circuit 302 can produce an output signal $RF_{out}$ based on inputs to PPA circuits 308 and components of PA circuit 302. To this extent, PA circuit 302 can also include, e.g., a third transistor 334 between transformer 310 and first transistor 304, and a fourth transistor 336 between transformer 310 and second transistor 306. Third transistor 334 may be electrically coupled at its source or drain region (e.g., source/drain region 126 (FIG. 2)) to the source or drain region of first transistor 304. Fourth transistor 336 may be electrically coupled at its source or drain region to the source or drain region of second transistor 306, as discussed herein relative to FIG. 7. As noted herein, each transistor 304, 306, 334, 336 can include a respective back-gate node $BG_1$, $BG_2$, $BG_3$, $BG_4$ electrically connected to a back-gate region 112 (FIG. 2) of the corresponding transistor structure (e.g., as shown in amplifier transistor 102 (FIG. 2)). By this arrangement, analog voltage source 220 can supply forward or reverse voltage biases to back-gate nodes $BG_1$, $BG_2$, $BG_3$, $BG_4$ of each transistor 304, 306, 334, 336 of PA circuit 302. The connections between analog voltage source 220 and back-gate nodes $BG_1$, $BG_2$, $BG_3$, $BG_4$ of PA circuit 302 can further reduce the ramping time between dormant and active operating modes of PA circuit 302. Analog voltage source 220 can additionally or alternatively be connected to back-gate nodes of only two transistors (e.g., nodes $BG_1$, $BG_2$ in PA circuit 202) of other amplifier circuits.

Figure 9:
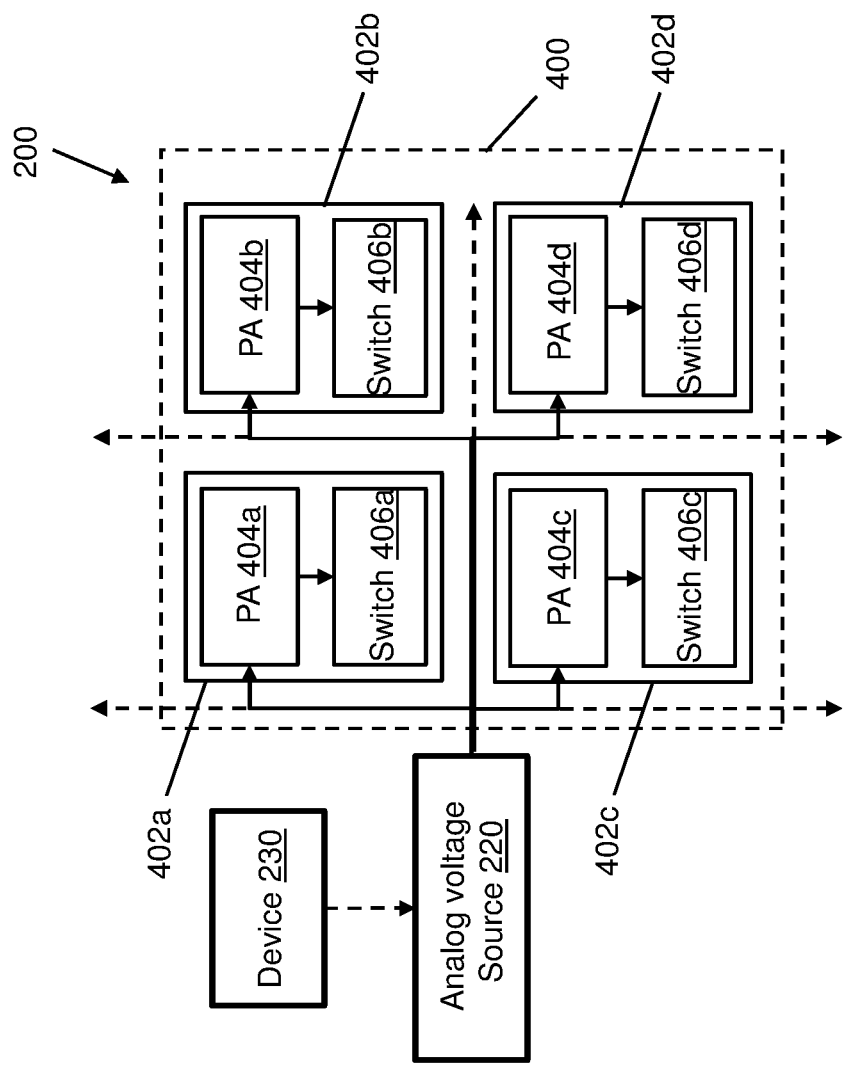
FIG. 9 shows a schematic view of a circuit structure with an array of digital power amplifier (DPA) cells according to embodiments of the disclosure.
Figure 10:
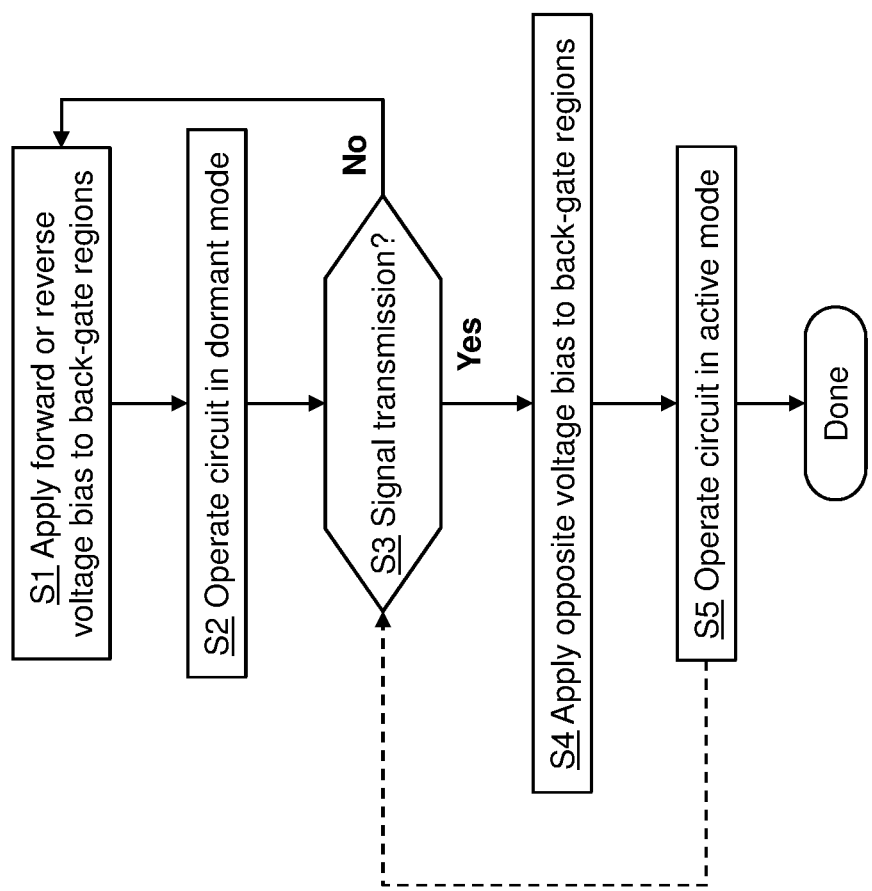
FIG. 10 shows an illustrative flow diagram of a method for adjusting power amplification according to embodiments of the disclosure.

Turning to FIG. 9, circuit 200 can additionally or alternatively include additional amplifier arrangements to support a wide variety of products and applications. As shown, analog voltage source 220 can be electrically coupled to an array of digital power amplifier (DPA) cells 402 (an example set of four being labeled 402a, 402b, 402c, 402d, respectively), each of which may be configured to provide different power amplification functions in circuit 200. DPA cells 402 may serve a similar technical function to PA circuits 202 (FIGS. 3, 7-8), 302 (FIG. 8) described elsewhere herein, but may have different underlying components (e.g., switched capacitors) adapted for use in specific forms of digital circuitry. DPA cells 402 can alternatively be partially or completely identical in structure and/or function to PA circuit(s) 202 (FIGS. 3, 7-8), 302 (FIG. 8) described herein. Each DPA cell 402 can be configured to amplify a digital input signal for transmission to other circuit components. Although four DPA cells 402 are shown in FIG. 9 for the purposes of example, it is understood that circuit 200 can include any desired number of DPA cells 402, e.g., one cell, five cells, twenty cells, one hundred or more cells, etc. Analog voltage source 220 can be electrically coupled in parallel to each PA circuit 404a, 404b, 404c, 404d in DPA cells 402. Each DPA cell 402 may also include a control switch (simply "switch" in FIG. 9 and hereafter) 406a, 406b, 406c, 406d. Switches 406 can separately govern the operation of its respective DPA cell 402, such that other circuit components can enable or disable amplification at each DPA cell 402 based on user input or operating conditions.

Referring to FIGS. 4, 7, 8, and 10 together, embodiments of the disclosure include methods for adjusting power amplification in a circuit structure, e.g., through the operation of circuit 200 (FIGS. 3, 7-9) described herein. Methods according to the disclosure can include, e.g., applying an initial bias voltage to back-gate nodes $BG_1$, $BG_2$, $BG_3$, and/or $BG_4$ in PA circuit(s) 202, 302 step S1. Applying the initial voltage bias to back-gate nodes $BG_1$, $BG_2$, $BG_3$, and/or $BG_4$ in step S1 can include, e.g., transmitting an initial voltage from analog voltage source 220 to PA circuit 202, 302.

After applying the initial voltage bias in step S1, embodiments of the disclosure can include continuing to operate circuit 200 and/or related device(s) 230 in a dormant mode at step S2, e.g., performing one or more operative functions without transmitting and/or receiving signals from other devices in the same network. During operation of circuit 200 and/or device 230 in a dormant mode, analog voltage source can continue to apply the initial voltage bias of step S1 to first and second transistors 204, 206 of PA circuit 202 (alternatively, transistors 304, 306 of PA circuit 302) at back-gate regions thereof (e.g., back-gate nodes $BG_1$, $BG_2$) with analog voltage source 220. It is therefore understood that steps S1, S2 may be implemented sequentially and/or simultaneously to accommodate the structure of circuit 200 and/or user preference. As discussed elsewhere herein, each transistor can be structured to include back-gate region 112 (FIG. 2) of doped substrate material separated from source/drain and channel regions 126, 127 (FIG. 2) by buried insulator layer 124 (FIG. 2). During operation of circuit 200 and/or device 230 in dormant mode during step S2, the voltage bias can be, e.g., a voltage of approximately +2.0 V or an opposite polarity voltage of approximately −6.0 V. As described elsewhere herein, embodiments of the disclosure can include adjusting the power output and/or high and low voltages produced from analog voltage source 220 before applying a forward or reverse bias in step S1. In particular, a preliminary action in embodiments of the present disclosure can include offsetting a power output from LUT 222 to compensate for fast corners, slow corners, and/or other manufacturing or operating variations. In still other embodiments, preliminary actions according to the disclosure can include adjusting high and low power voltage outputs to account for different operating situations (e.g., differences in temperature) and/or device structures.

Circuit 200 and device 230 may subsequently begin transmitting and/or receiving signals from other devices in the same network, referred to elsewhere herein as operating in an active mode. Methods according to the disclosure can therefore include step S3 of determining whether circuit 200 and circuit 230 have begun to operate in an active mode. The determination in step S3 can be based to one or more criteria discussed herein and/or otherwise corresponding to amplifying power output with circuit 200. As examples, step S3 can include signaling (e.g., with LUT 222) voltage source 220 that circuit 200 has begun to operate in its active mode. Such signaling may be directly encoded and/or derived from other operational characteristics, e.g., the temperature of circuit 200 and/or device 230 exceeding a threshold value. Threshold temperature values for indicating operation in an active mode can include, e.g., from approximately −10.0° C. to approximately 85.0° C. Where operation in dormant mode continues (i.e., "No" at step S3), the method flow can return to step S2 of operating circuit 200 and device 230 in a dormant mode. In addition to the examples discussed herein, dormant operating mode generally corresponds to any operating condition with low power per dBm, while active operating mode generally corresponds to full power or a predetermined fraction of full power.

Where circuit 200 begins operating in an active mode (i.e., "Yes" at step S3), the flow can proceed to other steps for reducing the ramping time between operation in dormant and active modes. In this case, the flow can proceed to step S4 of applying, with analog voltage source 220, the opposite (forward or reverse) voltage bias (e.g., with analog voltage source 220) to back-gate nodes $BG_1$, $BG_2$, $BG_3$, and/or $BG_4$ to reduce the transient time period before PA circuit 202, 302 produces a power output sufficient for signal transmission and/or receipt. The flow can thus include, at step $S_5$, operating circuit 200 in its active mode subsequent to and/or simultaneously with applying the opposite voltage bias to back-gate nodes $BG_1$, $BG_2$, $BG_3$, and/or $BG_4$ of corresponding transistors in PA circuit 202, 302. Methods according to the present disclosure can then conclude ("Done") or return to step S3 of determining whether circuit 200 continues to operate in an active mode or returns to operating in a dormant mode. Thus, methods according to the present disclosure can proceed in a continuous loop for accommodating dormant and active modes of circuit 200.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure comprising:
a power amplifier (PA) circuit having first and second transistors, the first and second transistors each including a back-gate region, wherein the back-gate region of each of the first and second transistors is positioned within a doped substrate separated from a semiconductor region by a buried insulator layer; and
an analog voltage source coupled to the back-gate regions of the first and second transistors of the PA circuit, such that the analog voltage source alternatively supplies a forward bias voltage or a reverse bias voltage to the back-gate regions of the first and second transistors of the PA circuit to produce a continuously sloped power ramping profile.

2. The circuit structure of claim 1, wherein the shared substrate comprises a fully-depleted semiconductor-on-insulator (FDSOI) substrate.

3. The circuit structure of claim 1, wherein the analog voltage source is further configured to switch between the positive bias voltage and the negative bias voltage during operation of the PA circuit in an active mode.

4. The circuit structure of claim 1, wherein the first and second transistors comprise portions of a cascode PA circuit.

5. The circuit structure of claim 4, wherein the cascode PA circuit further includes:
a third transistor having a source/drain region electrically coupled to a source/drain region of the first transistor; and
a fourth transistor having a source/drain region electrically coupled to a source/drain region of the second transistor,
the third and fourth transistor each including a back-gate region, and wherein the analog voltage source is electrically coupled to the back-gate regions of the third and fourth transistors of the cascode PA circuit, such that the analog voltage source alternatively supplies a forward bias voltage or a reverse bias voltage to the back-gate regions of the third and fourth transistors of the cascode PA circuit.

6. The circuit structure of claim 1, wherein the PA circuit comprises part of a digital power amplifier (DPA) cell in an array of DPA cells.

7. The circuit structure of claim 1, wherein an input voltage to the PA circuit is independent from an output voltage of the PA circuit.

8. The circuit structure of claim 1, wherein the analog voltage source supplies the forward bias voltage or the reverse bias voltage based on an operating mode and a temperature of the circuit structure.

9. A method for adjusting power amplification in a circuit structure, the method comprising:
applying one of a forward or a reverse voltage bias to first and second transistors in a power amplifier (PA) circuit at back-gate regions thereof during operation in a dormant mode, the back-gate regions of the first and second transistors including a doped substrate separated from a channel region by a buried insulator layer; and
operating the circuit structure in an active mode; and
applying the other of the forward or the reverse voltage bias to the back-gate regions of the first and second transistors in the power amplifier (PA) circuit while operating the circuit structure in the active mode to produce a continuously sloped power ramping profile.

10. The method of claim 9, wherein a ramping time between the dormant mode and the active mode is at most approximately three microseconds (μs) during the applying of the other of the forward or the reverse voltage bias to the back-gate regions of the first and second transistors in the PA circuit, and wherein a voltage profile of the PA circuit is continuously sloped during the ramping time.

11. The method of claim 9, wherein operating the circuit structure in the active mode while applying the other of the forward or the reverse voltage bias yields a continuously sloped power output from the PA circuit between operation in the dormant mode and operation in the active mode.

12. The method of claim 9, wherein the back-gate terminals of the first and second transistors are positioned within a fully-depleted semiconductor-on-insulator (FDSOI) substrate.

13. The method of claim 9, wherein applying the other of the forward or the reverse voltage bias to the back-gate terminals of the first and second transistors in the PA circuit includes signaling an analog voltage source to produce the other of the forward or the reverse voltage bias.

14. The method of claim 13, further comprising adjusting a power output from a digital lookup table (LUT) of the analog voltage before applying the other of the forward or the reverse voltage bias to the back-gate terminals of the first and second transistors in the PA circuit.

15. The method of claim 9, further comprising applying the other of the forward or the reverse voltage bias to the back-gate terminals of the first and second transistors in the PA circuit while operating the circuit structure an elevated temperature.

16. A circuit structure comprising:
a power amplifier (PA) circuit having first and second transistors, each of the first and second transistors including:
a dopant-implanted substrate, the dopant-implanted substrate defining a back-gate region;
a buried insulator layer positioned on the dopant-implanted substrate, and
a fully-depleted semiconductor-on-insulator (FDSOI) layer positioned on the buried insulator layer, wherein the buried insulator layer separates the FDSOI layer from the back-gate region, wherein the FDSOI layer includes a source region, a channel region, and a drain region; and
an analog voltage source electrically coupled to the back-gate regions of the first and second transistors of the PA circuit, such that the analog voltage source alternatively supplies a forward bias voltage or a reverse bias voltage to the back-gate regions of the first and second transistors of the PA circuit to produce a continuously sloped power ramping profile.

17. The circuit structure of claim 16, wherein the analog voltage source is further configured to switch between the forward bias voltage and the reverse bias voltage during operation of the PA circuit in an active mode.

18. The circuit structure of claim 16, wherein the analog voltage source includes:
a digital lookup table (LUT) having an input node coupled to a device;
a digital-analog-converter (DAC) having an input node coupled to an output from the LUT; and a filter circuit having an input node coupled to an output from the DAC, and an output node coupled to the back-gate regions of the first and second transistors of the PA circuit.

19. The circuit structure of claim 16, wherein an input voltage to the PA circuit is independent from an output voltage of the PA circuit.

20. The circuit structure of claim 16, wherein the analog voltage source supplies the forward bias voltage or the reverse bias voltage based on an operating mode and a temperature of the circuit structure.

* * * * *